(12) United States Patent
Wu et al.

(10) Patent No.: US 10,777,543 B2
(45) Date of Patent: Sep. 15, 2020

(54) LIGHT EMITTING DIODE DISPLAY APPARATUS AND MANUFACTURING METHOD THEREOF

(71) Applicant: Au Optronics Corporation, Hsinchu (TW)

(72) Inventors: Yang-En Wu, Hsinchu (TW); Sung-Yu Su, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/566,897

(22) Filed: Sep. 11, 2019

(65) Prior Publication Data
US 2020/0083206 A1 Mar. 12, 2020

(30) Foreign Application Priority Data
Sep. 11, 2018 (TW) .............................. 107131885 A

(51) Int. Cl.
| | |
|---|---|
| H01L 33/50 | (2010.01) |
| H01L 25/18 | (2006.01) |
| H01L 27/15 | (2006.01) |
| H01L 33/38 | (2010.01) |
| H01L 33/62 | (2010.01) |

(Continued)

(52) U.S. Cl.
CPC .............. *H01L 25/18* (2013.01); *H01L 25/50* (2013.01); *H01L 27/15* (2013.01); *H01L 33/0093* (2020.05); *H01L 33/38* (2013.01); *H01L 33/505* (2013.01); *H01L 33/52* (2013.01); *H01L 33/62* (2013.01); *H01L 25/167* (2013.01); *H01L 33/08* (2013.01); *H01L 2933/0041* (2013.01)

(58) Field of Classification Search
CPC ........ H01L 25/167; H01L 33/08; H01L 33/50
See application file for complete search history.

(56) References Cited

U.S. PATENT DOCUMENTS

| | | | |
|---|---|---|---|
| 8,581,297 B2 | 11/2013 | Obana et al. | |
| 8,586,977 B2 | 11/2013 | Obana et al. | |

(Continued)

FOREIGN PATENT DOCUMENTS

| | | |
|---|---|---|
| CN | 102082240 | 6/2011 |
| CN | 107611120 | 1/2018 |

(Continued)

*Primary Examiner* — George R Fourson, III
(74) *Attorney, Agent, or Firm* — JCIPRNET

(57) ABSTRACT

The light emitting diode display apparatus including a first substrate, a plurality of light emitting diodes, an adhesive layer, a color layer, and a second substrate is provided. The first substrate has a plurality of switching elements. The light emitting diode includes a first semiconductor layer, a plurality of second semiconductor layers, a plurality of light emitting layers, a first electrode, and a plurality of second electrodes. The first electrode is disposed on the first semiconductor layer. The second electrodes are respectively disposed on the corresponding second semiconductor layers. Each of the second electrodes is electrically connected to the corresponding switching element. The adhesive layer and the first substrate are respectively located at two opposite sides of the light emitting diode. The color layer is disposed on the first substrate and covers the adhesive layer and the light emitting diode. The second substrate is disposed opposite to the first substrate.

10 Claims, 10 Drawing Sheets

(51) Int. Cl.
*H01L 33/52* (2010.01)
*H01L 25/00* (2006.01)
*H01L 33/00* (2010.01)
*H01L 25/16* (2006.01)
*H01L 33/08* (2010.01)

(56) References Cited

U.S. PATENT DOCUMENTS

| | | | |
|---|---|---|---|
| 9,941,452 B2 | 4/2018 | Mao et al. | |
| 2003/0201445 A1* | 10/2003 | Park | H01L 27/3253 257/79 |
| 2003/0205970 A1* | 11/2003 | Park | H01L 27/3246 313/506 |
| 2004/0014251 A1* | 1/2004 | Park | H01L 51/0024 438/22 |
| 2005/0139820 A1* | 6/2005 | Park | H01L 27/3251 257/40 |
| 2005/0139839 A1* | 6/2005 | Park | H01L 27/3251 257/79 |
| 2005/0140275 A1* | 6/2005 | Park | H01L 27/322 313/504 |
| 2005/0140276 A1* | 6/2005 | Park | H01L 27/322 313/504 |
| 2005/0140308 A1* | 6/2005 | Park | H01L 27/3262 315/169.3 |
| 2005/0162070 A1* | 7/2005 | Park | H01L 27/3251 313/503 |
| 2005/0162077 A1* | 7/2005 | Park | H01L 51/5259 313/504 |
| 2006/0055999 A1* | 3/2006 | Bae | H01L 27/3251 359/245 |
| 2007/0146584 A1 | 6/2007 | Wang et al. | |
| 2011/0037926 A1 | 2/2011 | Tsukahara et al. | |
| 2011/0114927 A1 | 5/2011 | Obana et al. | |
| 2012/0295381 A1 | 11/2012 | Obana et al. | |
| 2014/0232962 A1 | 8/2014 | Ishida et al. | |
| 2014/0302244 A1 | 10/2014 | Ling et al. | |
| 2017/0263828 A1 | 9/2017 | Mao et al. | |
| 2018/0081211 A1 | 3/2018 | Ishida et al. | |
| 2018/0247922 A1 | 8/2018 | Robin et al. | |

FOREIGN PATENT DOCUMENTS

| | | |
|---|---|---|
| CN | 107731863 | 2/2018 |
| TW | I588984 | 6/2017 |
| TW | 201729396 | 8/2017 |
| TW | 201733105 | 9/2017 |

* cited by examiner

LIGHT EMITTING DIODE DISPLAY APPARATUS AND MANUFACTURING METHOD THEREOF

CROSS REFERENCE TO RELATED APPLICATION

This application claims the priority benefit of Taiwan application serial no. 107131885, filed on Sep. 11, 2018. The entirety of the above-mentioned patent application is hereby incorporated by reference herein and made a part of specification.

BACKGROUND OF THE INVENTION

Field of the Invention

The invention relates to a display apparatus, and particularly relates to a light emitting diode display apparatus.

Description of Related Art

Although the mainstream displays on the market are liquid crystal displays and organic light emitting diode displays, with the progress of science and technology, the size of many photoelectric elements has gradually grown to miniaturization. After miniaturization, the light emitting diode, as a backlight source of the liquid crystal display, can be partitioned into smaller units and can operate its light and dark. Therefore, the miniaturized light emitting diode can be applied to high dynamic range (HDR) technology or further as the display. However, the application of miniaturized light emitting diodes as displays still faces many problems. In particular, in the process of mass transfer of light emitting diode elements after encapsulation, it is often difficult to carry out the mass transfer, and even has the problem of poor mass transfer yield.

SUMMARY OF THE INVENTION

The invention provides a light emitting diode display apparatus, which can provide a wide color gamut color specification.

The invention also provides a manufacturing method of a light emitting diode display apparatus, which can be used to manufacture the aforementioned light emitting diode display apparatus and can improve the mass transfer yield.

The invention provides a light emitting diode display apparatus including a first substrate, a plurality of light emitting diodes, an adhesive layer, a color layer, and a second substrate. The first substrate has a plurality of switching elements. The light emitting diode includes a first semiconductor layer, a plurality of second semiconductor layers, a plurality of light emitting layers, a first electrode, and a plurality of second electrodes. The light emitting layers are respectively disposed between the first semiconductor layer and the corresponding second semiconductor layer. The first electrode is disposed on the first semiconductor layer. The second electrodes are respectively disposed on the corresponding second semiconductor layers. Each of the second electrodes is electrically connected to the corresponding switching element. The adhesive layer is disposed on the first substrate. The adhesive layer and the first substrate are respectively located at two opposite sides of the light emitting diodes. The color layer is disposed on the first substrate and covers the adhesive layer and the light emitting diodes. The color layer includes a plurality of color units and a plurality of barriers, and each of the barriers is disposed between each of the color units. The second substrate is disposed opposite to the first substrate, and the second substrate covers the color layer, the adhesive layer, and the light emitting diodes.

The invention provides a manufacturing method of a light emitting diode display apparatus including the following steps. A first component is formed, a second component is formed, and the first component is disposed opposite to the second component. The step of forming the first component includes the following steps. A first substrate is provided, and the first substrate has a plurality of switching elements. A plurality of light emitting diodes are formed on a growth substrate. The light emitting diodes are transferred onto the first substrate. An adhesive layer is formed on the first substrate. The adhesive layer and the first substrate are respectively located at two opposite sides of the light emitting diodes. The step of forming the second component includes the following steps. A second substrate is provided, and a color layer is formed on the second substrate. The color layer includes a plurality of color units and a plurality of barriers, and each of the barriers is disposed between each of the color units. The first component is made to be disposed opposite to the second component. The color layer covers the adhesive layer and the light emitting diodes, and the second substrate covers the color layer, the adhesive layer, and the light emitting diodes.

The light emitting diode display apparatus according to one of the aforementioned embodiments can provide a wide color gamut color specification.

The manufacturing method of the light emitting diode display apparatus according to one of the aforementioned embodiments can improve the mass transfer yield.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
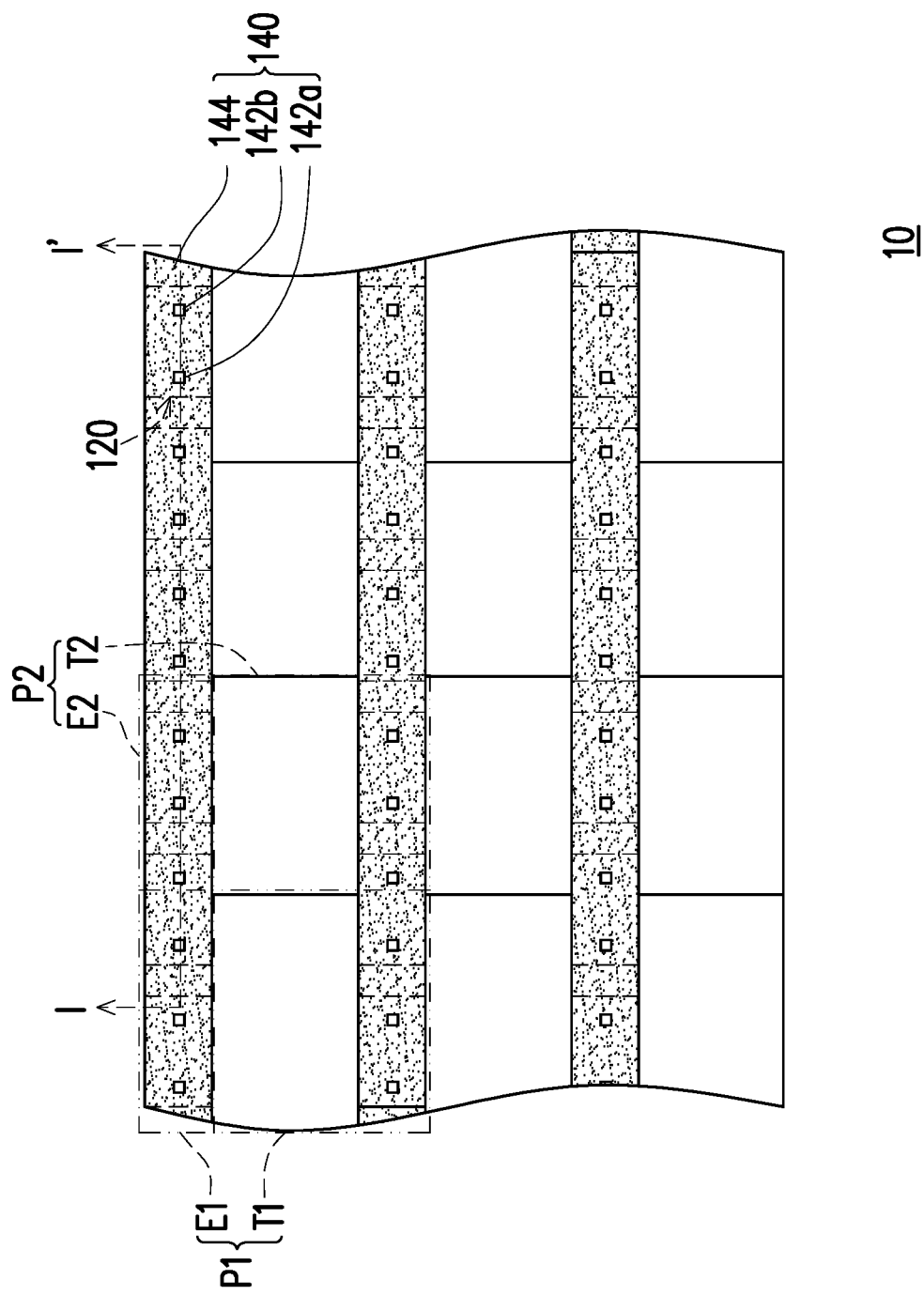
FIG. 1A is a schematic top view illustrating a light emitting diode display apparatus according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
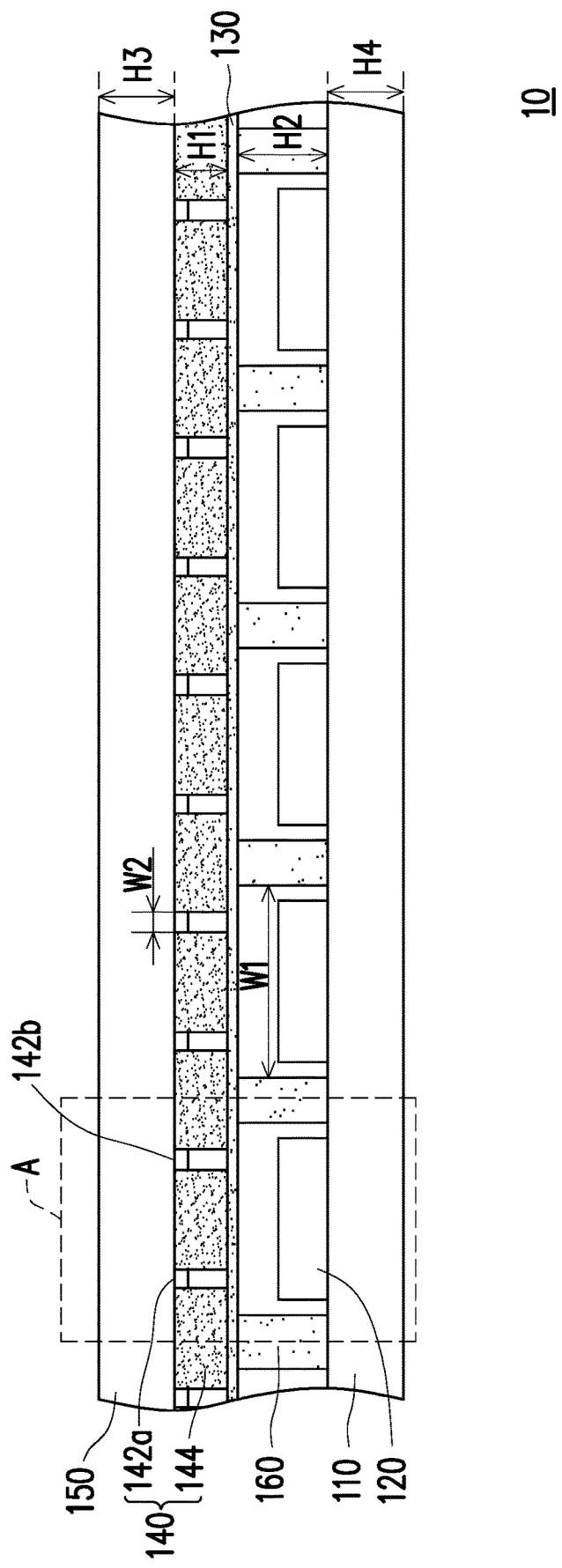
FIG. 1B is a schematic cross-sectional view illustrating the light emitting diode display apparatus of FIG. 1A along an I-I' section line.
Figure 1C:
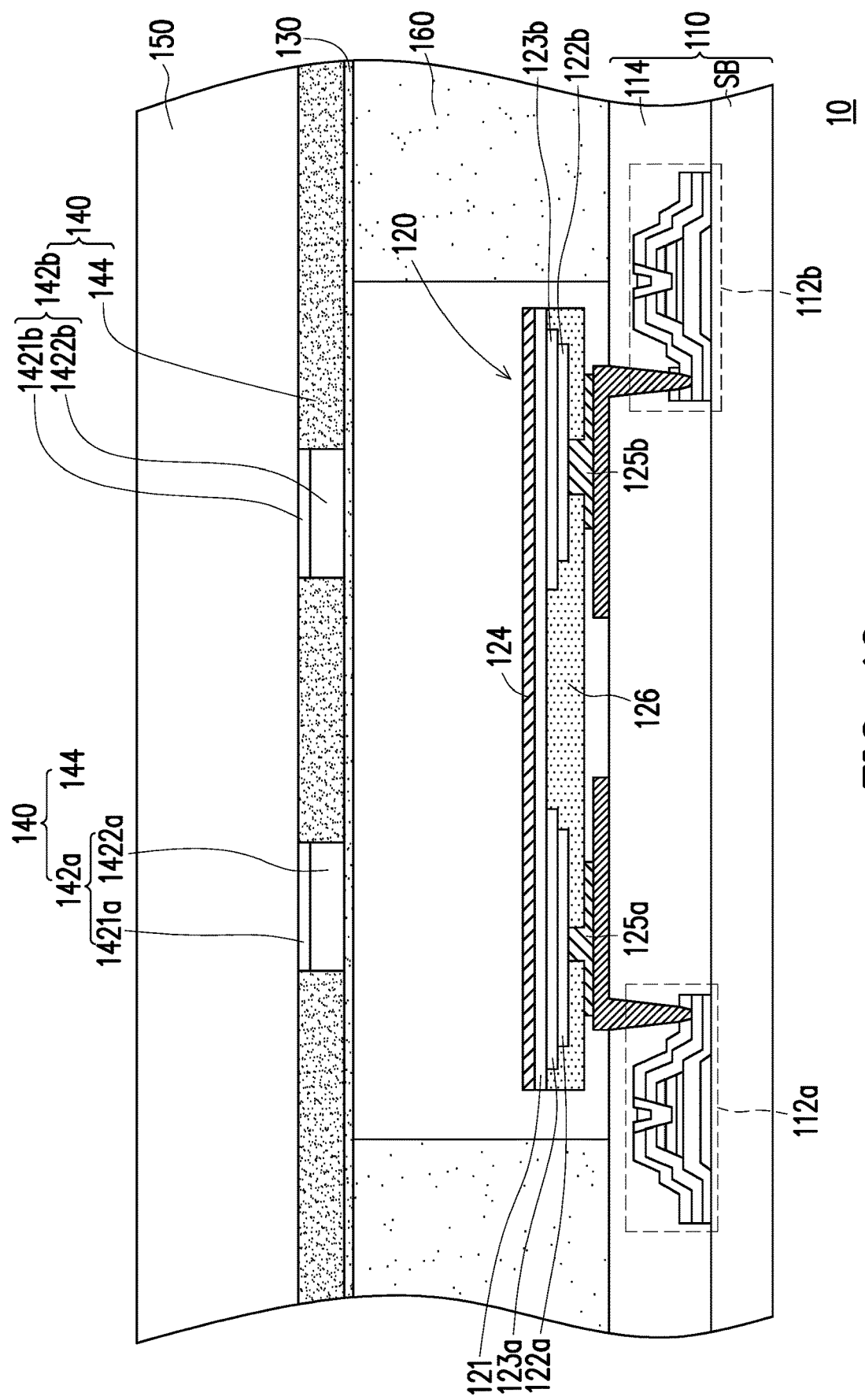
FIG. 1C is an enlarged view illustrating an area A of FIG. 1B.

FIG. 1A is a schematic top view illustrating a light emitting diode display apparatus according to an embodiment of the invention. FIG. 1B is a schematic cross-sectional view illustrating the light emitting diode display apparatus of FIG. 1A along an I-I' section line. FIG. 1C is an enlarged view illustrating an area A of FIG. 1B. For convenience of description, an adhesive layer 130 and a second substrate 150 of a light emitting diode display apparatus 10 in FIG. 1A are omitted.

Referring to FIG. 1A to FIG. 1C, the light emitting diode display apparatus 10 of the present embodiment includes a first substrate 110, a plurality of light emitting diodes 120 (a plurality are schematically illustrated in FIG. 1A), the adhesive layer 130, a color layer 140, and the second substrate 150. The first substrate 110 has a plurality of switching elements 112a and 112b (two are schematically illustrated in FIG. 1C). Each of the light emitting diodes 120 includes a first semiconductor layer 121, a plurality of second semiconductor layers 122a and 122b (two are schematically illustrated in FIG. 1C), a plurality of light emitting layers 123a and 123b (two are schematically illustrated in FIG. 1C), a first electrode 124, a plurality of second electrodes 125a and 125b (two are schematically illustrated in FIG. 1C), and an insulation layer 126. The light emitting layer 123a (or the light emitting layer 123b) is disposed between the first semiconductor layer 121 and the corresponding second semiconductor layer 122a (or the second semiconductor layer 122b). The first electrode 124 is disposed on the first semiconductor layer 121 and adapted to receive a voltage. The second electrodes 125a and 125b are respectively disposed on the corresponding second semiconductor layers 122a and 122b. The second electrodes 125a and 125b are respectively and electrically connected to the corresponding second semiconductor layers 122a and 122b and the corresponding switching elements 112a and 112b. The adhesive layer 130 is disposed on the first substrate 110, and the adhesive layer 130 and the first substrate 110 are respectively located at two opposite sides of the light emitting diodes 120. The color layer 140 is disposed on the first substrate 110 and covers the adhesive layer 130 and the light emitting diodes 120. The color layer 140 includes a plurality of color units 142a and 142b (two are schematically illustrated in FIG. 1C) and a plurality of barriers 144 (three are schematically illustrated in FIG. 1C), and each of the barriers 144 is disposed between each of the color units 142a and 142b. The second substrate 150 is disposed opposite to the first substrate 110, and the second substrate 150 covers the color layer 140, the adhesive layer 130, and the light emitting diodes 120.

Specifically, referring to FIG. 1A, the light emitting diode display apparatus 10 includes a plurality of pixel units P1 and P2, and the pixel units P1 and P2 respectively include display areas E1 and E2 and non-display areas T1 and T2. Herein, a size of each of the pixel units P1 and P2 is, for example, between 40 microns and 400 microns, and preferably is, for example, 317.5 microns. In the present embodiment, the non-display area T1 may be a transparent area, so that a transmittance of the light emitting diode display apparatus 10 is greater than 60%, for example.

Referring to FIG. 1B and FIG. 1C, the color layer 140 is disposed between the second substrate 150 and the light emitting diodes 120. Each of the color units 142a and 142b and each of the barriers 144 in the color layer 140 are alternatively arranged. It should be noted that, in the area A, the color unit 142a is disposed corresponding to the light emitting layer 123a of the light emitting diodes 120, and the color unit 142b is disposed corresponding to the light emitting layer 123b of the light emitting diodes 120, so that the light emitted by the light emitting layer 123a can be displayed via the color unit 142a, and the light emitted by the light emitting layer 123b can be displayed via the color unit 142b. More specifically, the color unit 142a includes a color filter layer 1421a and a fluorescent material layer 1422a, and the second substrate 150 and the fluorescent material layer 1422a are respectively located at two opposite sides of the color filter layer 1421a. The color unit 142b includes a color filter layer 1421b and a fluorescent material layer 1422b, and the second substrate 150 and the fluorescent material layer 1422b are respectively located at two opposite sides of the color filter layer 1421b. The color filter layers 1421a and 1421b can respectively present different colors, so that the light emitting diodes 120 can emit red light, green light, or blue light.

Additionally, the first substrate 110 further includes a substrate SB and an insulation layer 114, wherein the switching elements 112a and 112b are disposed on the substrate SB, and the switching elements 112a and 112b are located between the insulation layer 114 and the substrate SB.

It should be noted that, in the present embodiment, the light emitting diode 120 of the light emitting diode display apparatus 10 has two light emitting layers 123a and 123b, and the light emitting layers 123a and 123b respectively have the second semiconductor layers 122a and 122b and the second electrodes 125a and 125b corresponding thereto. Then, the second electrodes 125a and 125b are also respectively and electrically connected to the switching elements 112a and 112b corresponding thereto. That is, the light emission of the two light emitting layers 123a and 123b of the light emitting diode 120 may be respectively controlled by different switching elements 112a and 112b, and thus the light emitted by each of the light emitting layers 123a and 123b can correspond to the color units 142a and 142b thereabove to display red light, green light, or blue light. In other words, each of the light emitting diodes 120 in the present embodiment has two light emitting positions, and each of the light emitting positions can be controlled by different switching elements 112a and 112b respectively. Besides, in the present embodiment, the light emitting diodes 120 are embodied as vertical light emitting diodes, but is not limited thereto. In other embodiments, the light emitting diodes may also be horizontal light emitting diodes or other types of light emitting diodes.

It should be noted that, the light emitting diode 120 of the light emitting diode display apparatus 10 in the present embodiment is represented by two light emitting layers 123a and 123b, two second semiconductor layers 122a and 122b, and two second electrodes 125a and 125b, but is not limited thereto. That is, in other embodiments, the light emitting diode of the light emitting diode display apparatus can also have more than two light emitting layers and the second semiconductor layers and the second electrodes equivalent to the number of the light emitting layers.

Additionally, in some embodiments, the light emitting diode display apparatus 10 further includes a glue layer 160 to encapsulate the light emitting diodes 120, and the color layer 140 and the first substrate 110 are respectively located at two opposite sides of the glue layer 160. Herein, the glue layer 160 may be, for example, a sealant, an optical glue, or other suitable optical glue materials, but is not limited thereto.

Referring to FIG. 1B, in some embodiments, a height H1 of the color layer 140 of the light emitting diode display apparatus 10 is 50 microns, for example; A height H2 of the glue layer 160 is 100 microns, for example; A height H3 of the second substrate 150 is 125 microns, for example; A height H4 of the first substrate 110 is 125 microns, for example; A width W1 of the light emitting diodes 120 is 150 microns, for example; A width W2 of the color units 142a and 142b is 20 microns, for example, but is not limited thereto.

It should be noted that, the reference numerals and a part of the contents in the previous embodiment are used in the following embodiments, in which like reference numerals refer to like or similar elements and repeated description of the same technical contents is omitted. For a detailed description of the omitted parts, reference can be made to the previous embodiment, and no repeated description is contained in the following embodiments.

Figure 1D:
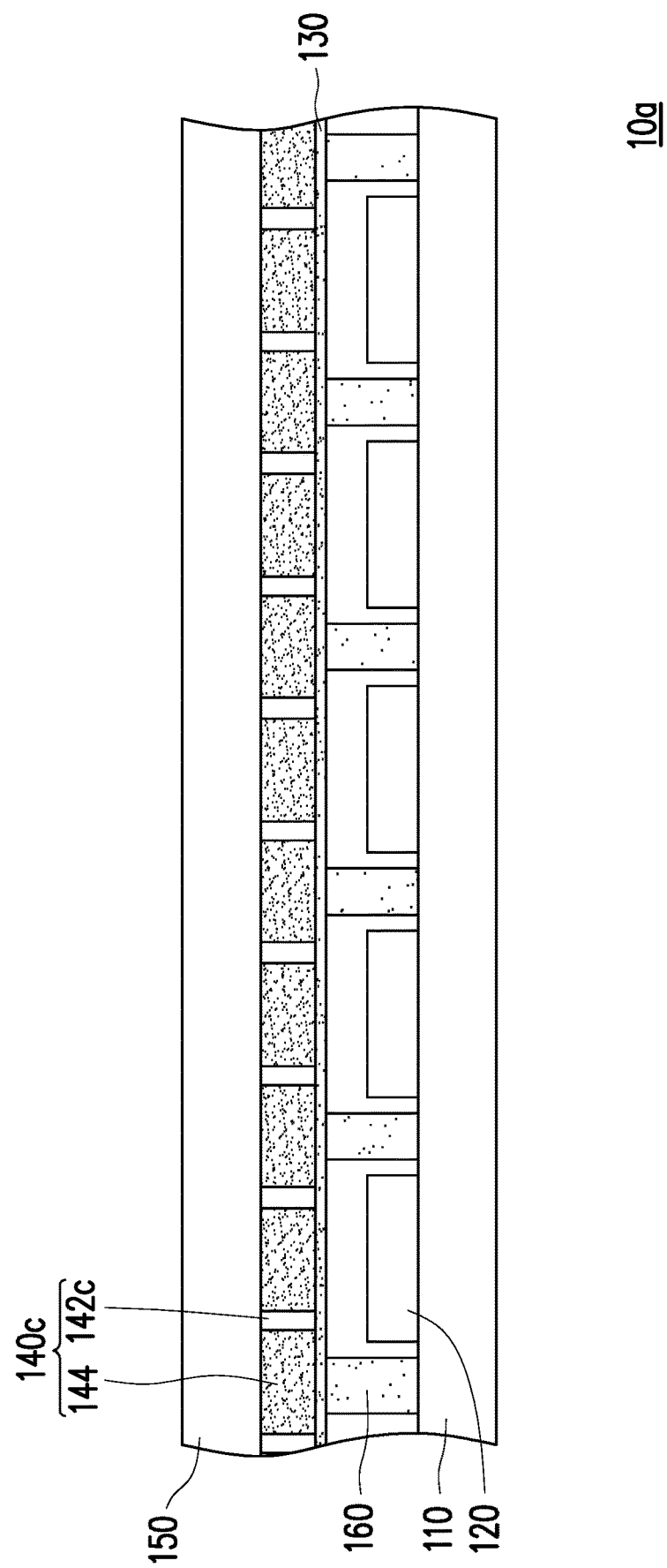
FIG. 1D and FIG. 1E are schematic cross-sectional views illustrating a micro light emitting diode display apparatus according to a plurality of embodiments of the invention.

It should be noted that, in the micro light emitting diode display apparatus 10, the color units 142a and 142b may include the color filter layers 1421a and 1421b and the fluorescent material layers 1422a and 1422b, but is not limited thereto. In some embodiments, a color unit 142c of a color layer 140c of a micro light emitting diode display apparatus 10a may also be a quantum dot material layer, as shown in FIG. 1D. In some embodiments, a color unit 142d of a color layer 140d of a micro light emitting diode display apparatus 10b may also include a color filter layer 1421d, and a fluorescent material layer 170 thereof is not disposed in the color layer 140d, as shown in FIG. 1E.

Figure 1E:
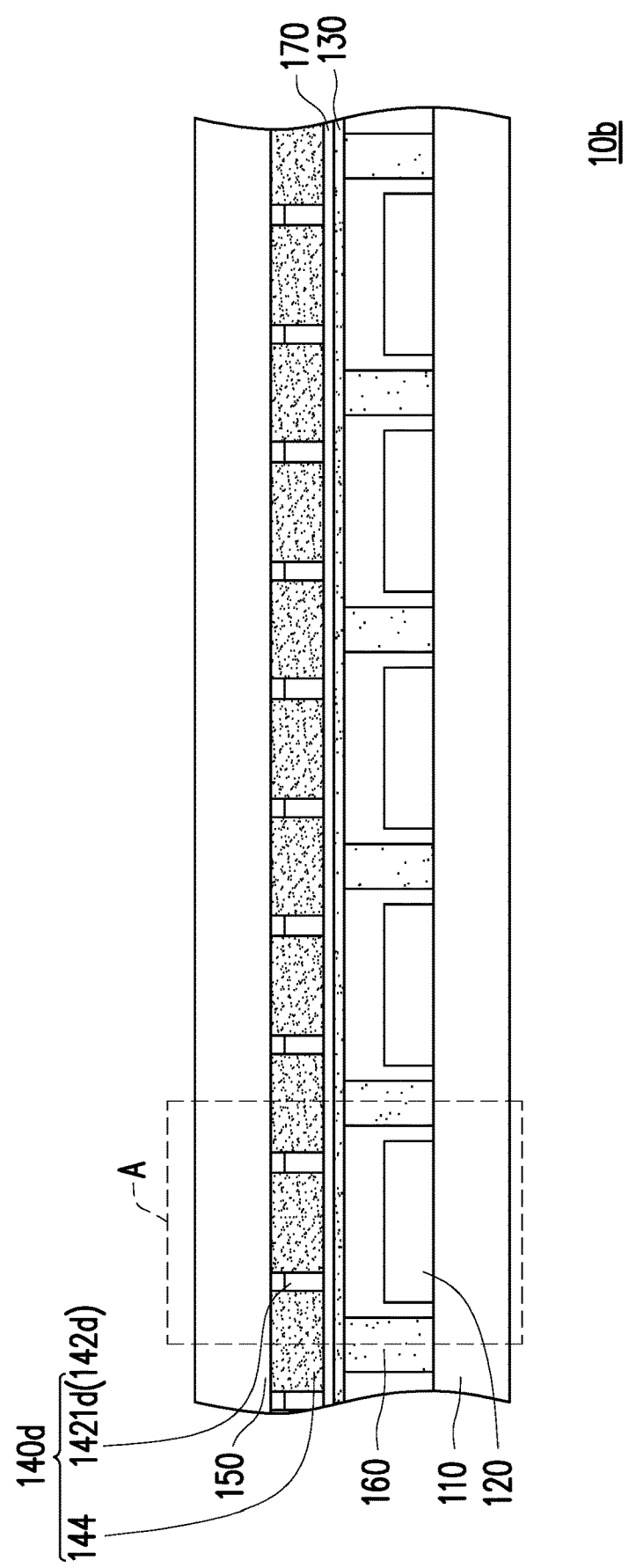

FIG. 1E is a schematic cross-sectional view illustrating a micro light emitting diode display apparatus according to another embodiment of the invention. Referring to FIG. 1B and FIG. 1E, the micro light emitting diode display apparatus 10b of the present embodiment is similar to the micro light emitting diode display apparatus 10 in FIG. 1B, and the main difference between the two is that, the color unit 142d of the color layer 140d of the micro light emitting diode display apparatus 10b of the present embodiment includes the color filter layer 1421d, and the light emitting diode display apparatus 10b further includes the fluorescent material layer 170. The fluorescent material layer 170 and the color layer 140d are different laminated layers. The fluorescent material layer 170 is disposed between the color layer 140d and the light emitting diodes 120, and the second substrate 150 and the fluorescent material layer 170 are respectively located at two opposite sides of the color layer 140d.

Based on the above, in the light emitting diode display apparatus 10 of the present embodiment, the light emitting diode 120 include the first semiconductor layer 121, the plurality of second semiconductor layers 122a and 122b, the plurality of light emitting layers 123a and 123b, the first electrode 124, and the plurality of second electrodes 125a and 125b. The light emitting layers 123a and 123b are respectively disposed corresponding to the second semiconductor layers 122a and 122b and the second electrodes 125a and 125b, and the second electrodes 125a and 125b are respectively and electrically connected to the corresponding switching elements 112a and 112b. By the design, the light emitting diode 120 of the present embodiment has at least two light emitting positions. Thereby, the light emitting diode display apparatus 10 can provide a wide color gamut color specification.

FIG. 2A to FIG. 2F are schematic cross-sectional views illustrating a manufacturing method of a light emitting diode display apparatus according to an embodiment of the invention.

In the present embodiment, a manufacturing method of a light emitting diode display apparatus 10c includes forming a first component 101c, forming a second component 102c, and making the first component 101c be disposed opposite to the second component 102c.

Figure 2A:
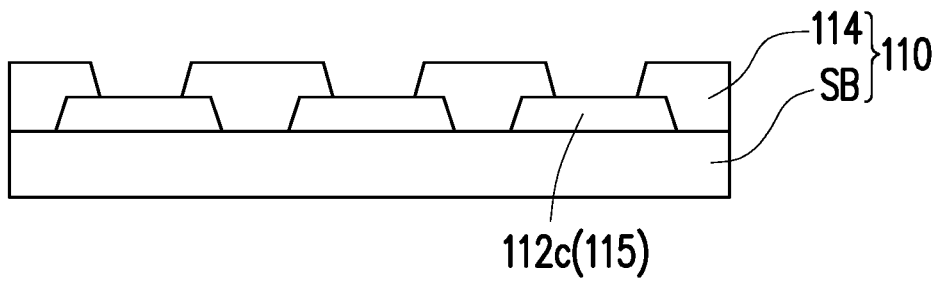
FIG. 2A to FIG. 2F are schematic cross-sectional views illustrating a manufacturing method of a light emitting diode display apparatus according to an embodiment of the invention.
Figure 2B:
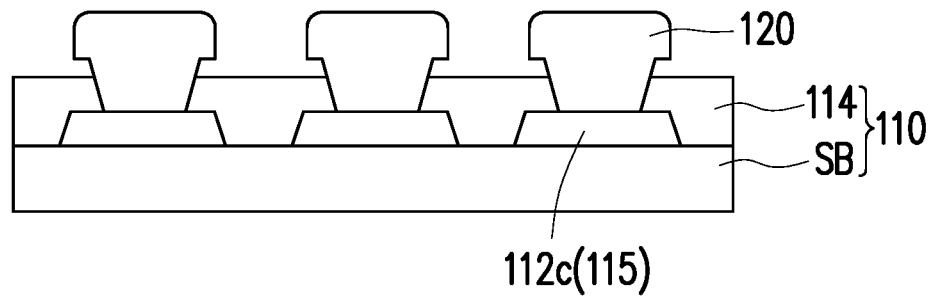
Figure 2C:
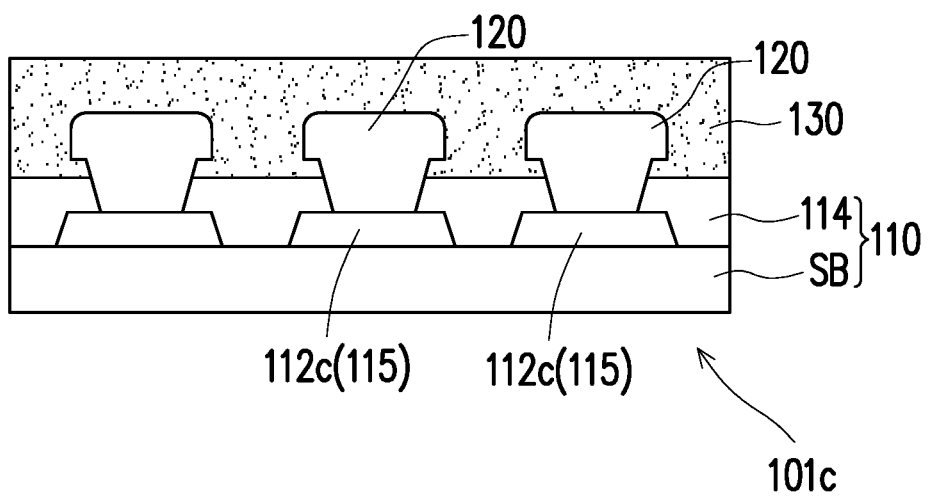

Specifically, first, referring to FIG. 2A to FIG. 2C, forming the first component 101c includes the following steps. As shown in FIG. 2A, the first substrate 110 is provided, and the first substrate 110 has a plurality of switching element sets 115, the insulation layer 114, and the substrate SB. Each of the switching element sets 115 includes a plurality of switching elements 112c. The switching elements 112c are disposed on the substrate SB, and the switching elements 112c are located between the insulation layer 114 and the substrate SB. Then, the plurality of light emitting diodes 120 are formed on a growth substrate (not shown). Further, as shown in FIG. 2B, the light emitting diodes 120 are transferred onto the first substrate 110, and the light emitting diodes 120 are disposed on the plurality of switching elements 112c exposed by the insulation layer 114. Then, as shown in FIG. 2C, the adhesive layer 130 is formed on the first substrate 110, so that the adhesive layer 130 encapsulates the light emitting diodes 120, and the adhesive layer 130 and the first substrate 110 are respectively located at two opposite sides of the light emitting diodes 120.

Figure 2D:
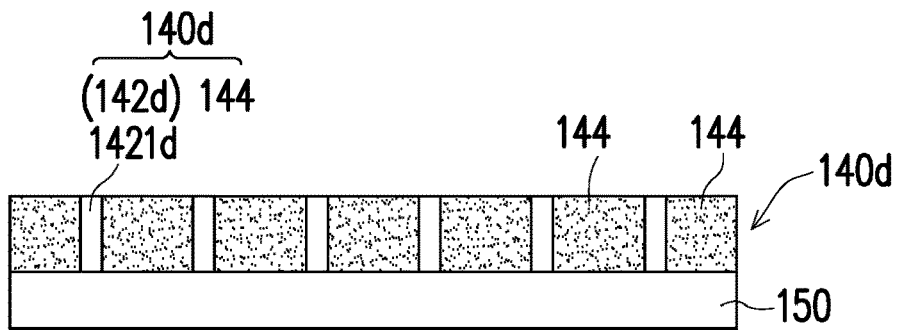
Figure 2E:
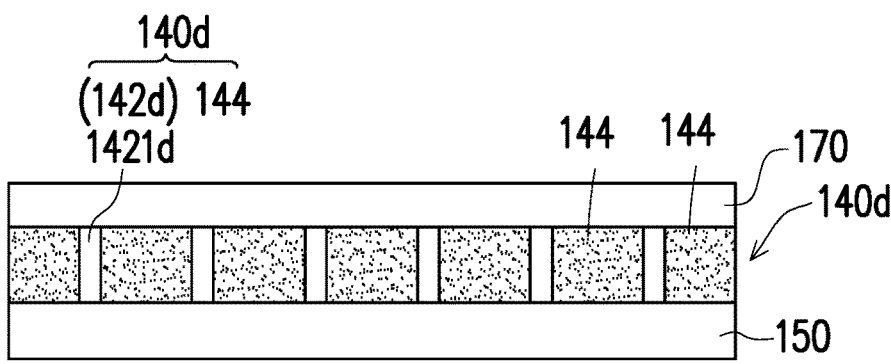

Then, referring to FIG. 2D to FIG. 2E, forming the second component 102c includes the following steps. As shown in FIG. 2D, the second substrate 150 is provided, and the color layer 140d is formed on the second substrate 150. The color layer 140d includes a plurality of color units 142d and a plurality of barriers 144. The color units 142d include a color filter layer 1421d, and each of the barriers 144 is disposed between each of the color units 142d. As shown in FIG. 2E, the fluorescent material layer 170 is formed on the color layer 140d, so that the fluorescent material layer 170 and the second substrate 150 are respectively located at two opposite of the color layer 140d.

Figure 2F:
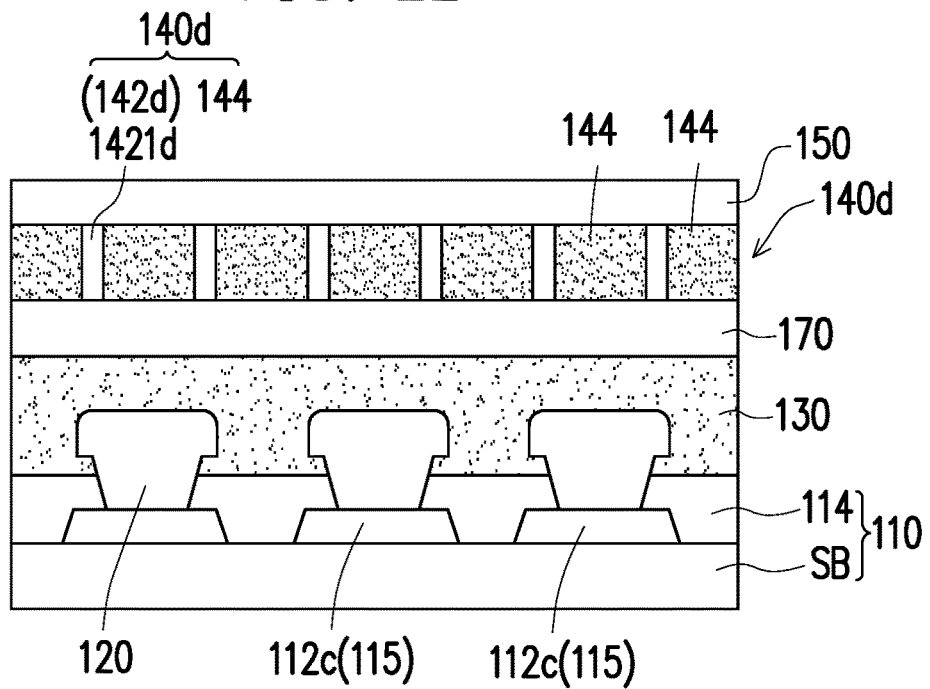

Lastly, referring to FIG. 2F, the first component 101c is disposed opposite to the second component 102c, so as to form the light emitting diode display apparatus 10c. The color layer 140d covers the fluorescent material layer 170, the adhesive layer 130, and the light emitting diodes 120, and the second substrate 150 covers the color layer 140d, the fluorescent material layer 170, the adhesive layer 130, and the light emitting diodes 120.

It should be noted that, since the present embodiment is adopted the aforementioned light emitting diodes 120, and the light emitting diode 120 includes two light emitting layers 123a and 123b, the second semiconductor layers 122a and 122b and the second electrodes 125a and 125b equivalent to the number of the light emitting layers 123a and 123b, the light emitting diode 120 has a wider width W1 (e.g., 150 microns) compared with the general micro light emitting diode. Additionally, since the light emitting diodes 120 do not pass through the packaging process and do not contain fluorescent layers, and the position of the fluorescent material layer 170 is additionally designed on the second substrate 150, the manufacturing method of the light emitting diode display apparatus 10c of the present embodiment can improve the mass transfer yield.

FIG. 3A to FIG. 3E are schematic cross-sectional views illustrating a manufacturing method of a light emitting diode display apparatus according to another embodiment of the invention. Referring to FIG. 2A to FIG. 2F and FIG. 3A to FIG. 3E, a manufacturing method of a micro light emitting diode display apparatus 10d of the present embodiment is similar to the manufacturing method of the micro light emitting diode display apparatus 10c in FIG. 2A to FIG. 2F, and the main difference between the two is that, in the manufacturing method of the micro light emitting diode display apparatus 10d of the present embodiment, the fluorescent material layer 170 is formed on the first substrate 110, and the micro light emitting diode display apparatus 10d further includes the glue layer 160.

Figure 3A:
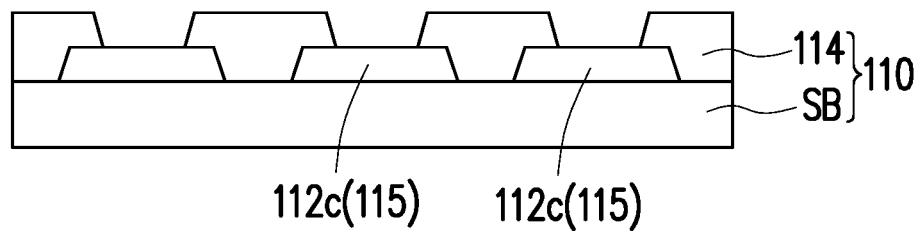
FIG. 3A to FIG. 3E are schematic cross-sectional views illustrating a manufacturing method of a light emitting diode display apparatus according to another embodiment of the invention.
Figure 3B:
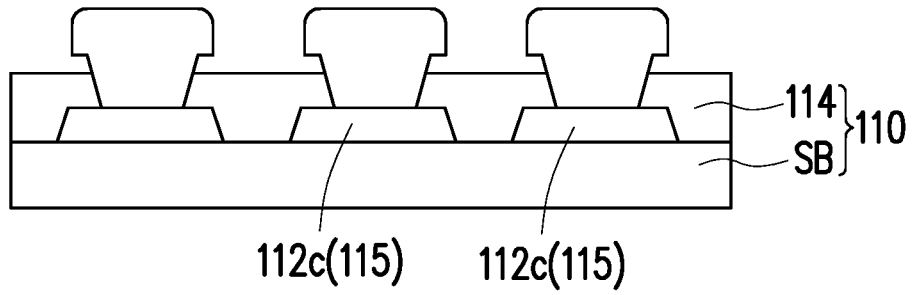
Figure 3C:
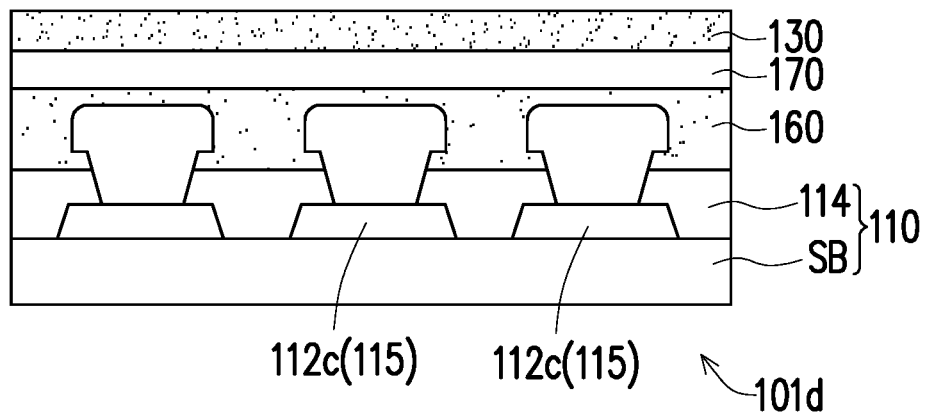
Figure 3D:
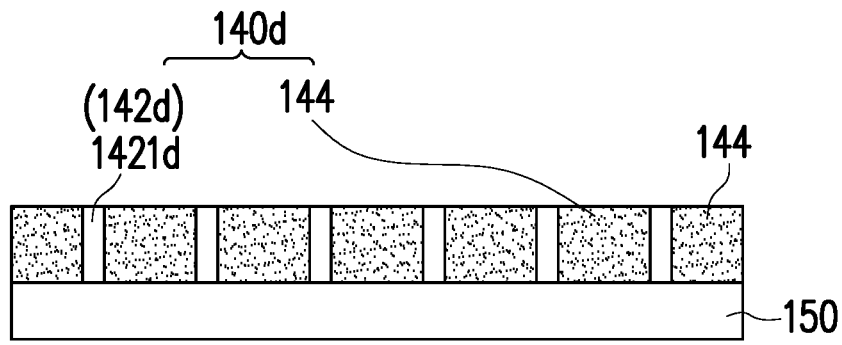

Specifically, referring to FIG. 3A to FIG. 3C, a first component 101d is formed. The steps of FIG. 3A to FIG. 3B are the same as that of FIG. 2A to FIG. 2B, and is not repeated again herein. Referring to FIG. 3C, before forming the adhesive layer 130 on the first substrate 110, the manufacturing method further includes forming the glue layer 160 to encapsulate the light emitting diodes 120, and forming the fluorescent material layer 170 on the glue layer 160, so that the fluorescent material layer 170 and the light emitting diode 120 are respectively located at two opposite sides of the glue layer 160. Then, referring to FIG. 3D, a second component 102d is formed, of which the step is the same as FIG. 2D, and is not repeated again herein. Lastly, referring to FIG. 3E, the first component 101d is disposed opposite to the second component 102d, so as to form the light emitting diode display apparatus 10d.

Figure 3E:
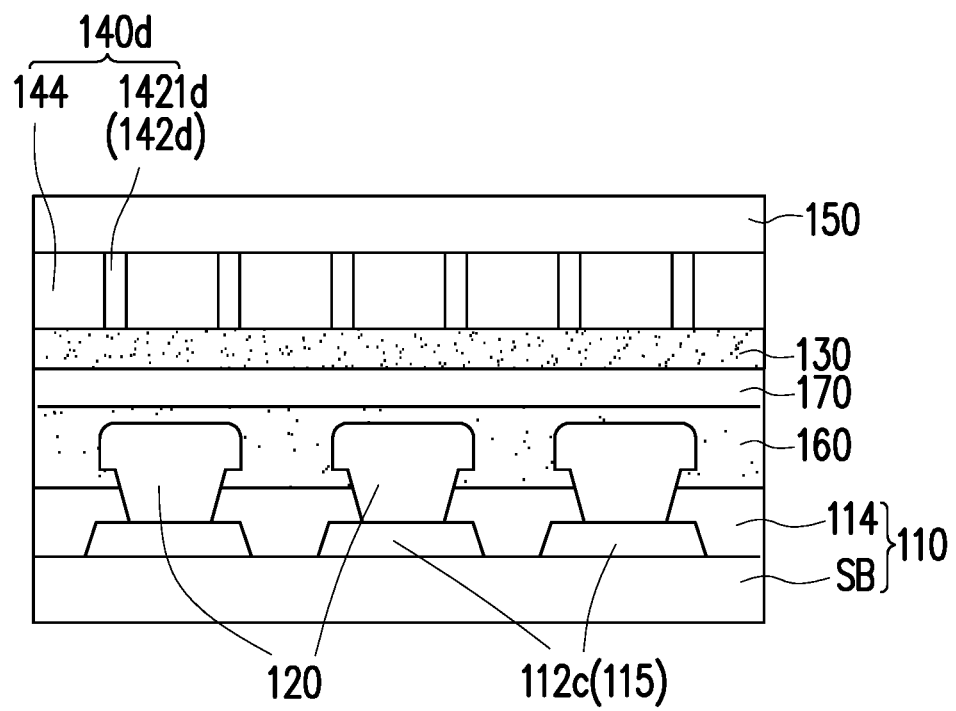
Figure 4:
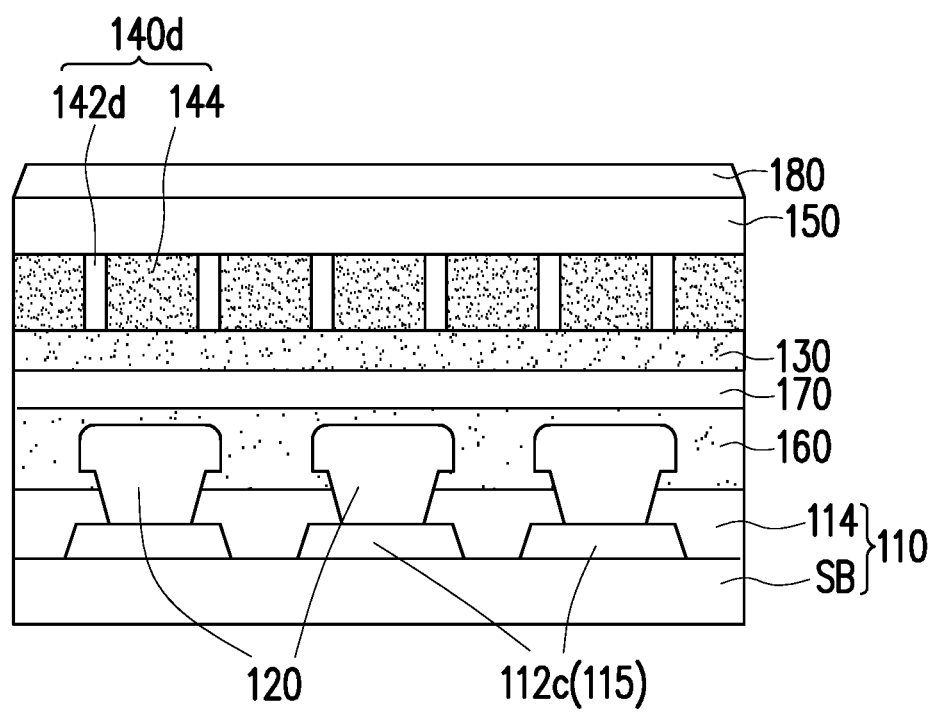
FIG. 4 is a schematic cross-sectional view illustrating a micro light emitting diode display apparatus according to another embodiment of the invention.

FIG. 4 is a schematic cross-sectional view illustrating a micro light emitting diode display apparatus according to another embodiment of the invention. Referring to FIG. 3E and FIG. 4, a micro light emitting diode display apparatus 10e of the present embodiment is similar to the micro light emitting diode display apparatus 10d in FIG. 3E, and the main difference between the two is that, the micro light emitting diode display apparatus 10e of the present embodiment further includes a touch control circuit layer 180. The touch control circuit layer 180 is disposed at one side of the second substrate 150 away from the color layer 140d, but is not limited thereto. In other embodiments, the touch control circuit layer 180 may also be disposed between the first substrate 110 and the second substrate 150, or disposed at one side of the first substrate 110 away from the light emitting diode 120.

In summary, in the light emitting diode display apparatus and the manufacturing method thereof of the present embodiment, the light emitting diode includes the plurality of second semiconductor layers, the plurality of light emitting layers, and the plurality of second electrodes. The light emitting layers are respectively disposed corresponding to the second semiconductor layers and the second electrodes, and each of the second electrodes is electrically connected to the corresponding switching element. By the design, each of the light emitting diodes can emit at least two colors of light and has a wider dimension. Thereby, the light emitting diode display apparatus of the present embodiment has a color specification which can provide a wide color gamut, and the mass transfer yield can be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A light emitting diode display apparatus, comprising:
   a first substrate, having a plurality of switching elements;
   a plurality of light emitting diodes, disposed on the first substrate, each of the light emitting diodes comprising:
      a first semiconductor layer;
      a plurality of second semiconductor layers;
      a plurality of light emitting layers, respectively disposed between the first semiconductor layer and the corresponding second semiconductor layer;
      a first electrode, disposed on the first semiconductor layer; and
      a plurality of second electrodes, respectively disposed on the corresponding second semiconductor layers, and each of the second electrodes being electrically connected to the corresponding switching element;
   an adhesive layer, disposed on the first substrate, and the adhesive layer and the first substrate being respectively located at two opposite sides of the light emitting diodes;
   a color layer, disposed on the first substrate and covering the adhesive layer and the light emitting diodes, wherein the color layer comprises a plurality of color units and a plurality of barriers, and each of the barriers is disposed between each of the color units; and
   a second substrate, disposed opposite to the first substrate, and the second substrate covering the color layer, the adhesive layer, and the light emitting diodes.

2. The light emitting diode display apparatus according to claim 1, wherein the color units comprise a color filter layer, and the light emitting diode display apparatus further comprises:
   a fluorescent material layer, disposed between the color layer and the light emitting diodes, so that the second substrate and the fluorescent material layer are respectively located at two opposite sides of the color layer.

3. The light emitting diode display apparatus according to claim 1, further comprising:
   a glue layer, encapsulating the light emitting diodes, wherein the color layer and the first substrate are respectively located at two opposite sides of the glue layer.

4. The light emitting diode display apparatus according to claim 1, wherein the color units comprise a color filter layer and a fluorescent material layer, and the second substrate and each of the fluorescent material layers are respectively located at two opposite sides of each of the color filter layers.

5. The light emitting diode display apparatus according to claim 1, wherein the color units comprise a quantum dot material layer.

6. A manufacturing method of a light emitting diode display apparatus, comprising:
   forming a first component, comprising:
      providing a first substrate, the first substrate having a plurality of switching elements;
      forming a plurality of light emitting diodes on a growth substrate;
      transferring the light emitting diodes onto the first substrate; and forming an adhesive layer on the first substrate, wherein the adhesive layer and the first substrate are respectively located at two opposite sides of the light emitting diodes;

forming a second component, comprising:
  providing a second substrate; and
  forming a color layer on the second substrate, wherein the color layer comprises a plurality of color units and a plurality of barriers, and each of the barriers is disposed between each of the color units; and making the first component be disposed opposite to the second component, wherein the color layer covers the adhesive layer and the light emitting diodes, and the second substrate covers the color layer, the adhesive layer, and the light emitting diodes.

7. The manufacturing method of the light emitting diode display apparatus according to claim 6, wherein the light emitting diodes at least comprise:
  a first semiconductor layer;
  a plurality of second semiconductor layers;
  a plurality of light emitting layers, respectively disposed between the first semiconductor layer and the corresponding second semiconductor layer;
  a first electrode, disposed on the first semiconductor layer; and
  a plurality of second electrodes, respectively disposed on the corresponding second semiconductor layers, and each of the second electrodes is electrically connected to the corresponding switching element.

8. The manufacturing method of the light emitting diode display apparatus according to claim 6, wherein when the color units comprising a color filter layer and a fluorescent material layer, before forming the color layer on the second substrate, further comprising:
  forming the color filter layer and the fluorescent material layer in the color units, so that the second substrate and each of the fluorescent material layers are respectively located at two opposite sides of each of the color filter layers.

9. The manufacturing method of the light emitting diode display apparatus according to claim 6, wherein when the color units comprising a color filter layer, after forming the color layer on the first substrate, further comprising:
  forming a fluorescent material layer on the color layer, so that the fluorescent material layer and the second substrate are respectively located at two opposite sides of the color layer.

10. The manufacturing method of the light emitting diode display apparatus according to claim 6, wherein the color units comprise a quantum dot material layer.

* * * * *